(12) United States Patent
Han et al.

(10) Patent No.: US 9,762,220 B2
(45) Date of Patent: Sep. 12, 2017

(54) FREQUENCY SYNTHESIZER AND METHOD CONTROLLING FREQUENCY SYNTHESIZER

(71) Applicant: SAMSUNG ELECTRONICS CO., LTD., Suwon-si, Gyeonggi-Do (KR)

(72) Inventors: Sang-Wook Han, Hwaseong-si (KR); Sung-Jun Lee, Suwon-si (KR); Joon-Hee Lee, Goyang-si (KR); Jong-Won Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/974,333

(22) Filed: Dec. 18, 2015

(65) Prior Publication Data
US 2016/0197601 A1 Jul. 7, 2016

(30) Foreign Application Priority Data
Jan. 2, 2015 (KR) .................... 10-2015-0000125

(51) Int. Cl.
| | | |
|---|---|---|
| H03K 3/03 | (2006.01) | |
| H03K 7/08 | (2006.01) | |
| H03K 5/131 | (2014.01) | |
| H03L 7/083 | (2006.01) | |
| H03L 7/181 | (2006.01) | |
| H03L 7/10 | (2006.01) | |
| H03L 7/197 | (2006.01) | |
| H03K 5/00 | (2006.01) | |

(52) U.S. Cl.
CPC ............. *H03K 5/131* (2013.01); *H03L 7/083* (2013.01); *H03L 7/102* (2013.01); *H03L 7/181* (2013.01); *H03L 7/1974* (2013.01); *H03K 2005/00071* (2013.01); *H03K 2005/00273* (2013.01); *H03L 2207/06* (2013.01)

(58) Field of Classification Search
CPC ......... H03K 5/131; H03K 2005/00071; H03K 2005/00273; H03L 7/083; H03L 7/102; H03L 7/181; H03L 7/1974; H03L 2207/06
USPC .............. 327/2–12, 105–123, 141, 144–163; 331/15–17; 375/373–376
See application file for complete search history.

(56) References Cited

U.S. PATENT DOCUMENTS

| | | |
|---|---|---|
| 6,774,732 B1 | 8/2004 | Harnishfeger et al. |
| 6,806,786 B1 * | 10/2004 | Lam .......................... H03L 7/10 327/147 |

(Continued)

FOREIGN PATENT DOCUMENTS

| | | |
|---|---|---|
| JP | H06132818 A | 5/1994 |
| JP | 2000049599 A | 2/2000 |

(Continued)

*Primary Examiner* — Brandon S Cole
(74) *Attorney, Agent, or Firm* — Volentine & Whitt, PLLC

(57) ABSTRACT

A voltage controlled oscillator (VCO) in a frequency synthesizer generates an output signal having a target frequency by being coarse tuned in accordance with a channel code derived through a binary tree search. Thereafter, the output signal of the VCO may be further tuned using a phase lock loop (PLL) circuit. Each stage of the binary tree search includes a comparison step that determines a channel code bit, and another step that confirms that the channel code converges to a final channel code within an established stage range value.

18 Claims, 10 Drawing Sheets

(56) References Cited

U.S. PATENT DOCUMENTS

| | | | |
|---|---|---|---|
| 6,903,613 B1* | 6/2005 | Mitchell | H03L 7/113 |
| | | | 331/11 |
| 6,911,850 B2 | 6/2005 | Okamura | |
| 7,034,624 B1 | 4/2006 | Gentile | |
| 7,103,127 B2* | 9/2006 | Damgaard | H03L 7/113 |
| | | | 327/105 |
| 7,332,973 B2 | 2/2008 | Lee et al. | |
| 7,349,514 B2 | 3/2008 | Meltzer et al. | |
| 7,375,563 B1* | 5/2008 | Cheung | H03K 5/1565 |
| | | | 327/147 |
| 7,583,773 B2* | 9/2009 | Su | H03L 7/183 |
| | | | 327/147 |
| 7,719,375 B2* | 5/2010 | Cho | H04B 1/46 |
| | | | 331/117 FE |
| 7,801,262 B2 | 9/2010 | Wallberg et al. | |
| 7,834,705 B2 | 11/2010 | Seo et al. | |
| 8,570,113 B2* | 10/2013 | Fischette | H03L 7/093 |
| | | | 331/15 |
| 2007/0121774 A1* | 5/2007 | Lee | H03L 7/10 |
| | | | 375/376 |
| 2009/0122937 A1 | 5/2009 | Maskou et al. | |
| 2014/0145769 A1* | 5/2014 | Lin | H03L 7/087 |
| | | | 327/158 |
| 2015/0349992 A1* | 12/2015 | Gao | H04B 1/16 |
| | | | 375/376 |

FOREIGN PATENT DOCUMENTS

| | | |
|---|---|---|
| JP | P2011124747 | 6/2011 |
| KR | 100498411 B1 | 6/2005 |
| KR | 100925156 | 11/2007 |
| KR | 20090047882 | 5/2009 |
| KR | 20090047882 A | 5/2009 |

\* cited by examiner

FREQUENCY SYNTHESIZER AND METHOD CONTROLLING FREQUENCY SYNTHESIZER

CROSS REFERENCE TO RELATED APPLICATION(S)

This application claims priority under 35 U.S.C. §119(a) to a Korean Patent Application No. 10-2015-0000125 filed on Jan. 2, 2015, the subject matter of which is hereby incorporated by reference.

BACKGROUND

The inventive concept relates generally to frequency synthesizers. More particularly, the inventive concept relates frequency synthesizers that are immune to channel coding errors during course tuning, as well as methods controlling frequency synthesizers in such a manner that channel coding errors are avoided.

A frequency synthesizer is a device capable of generating a range of discrete output signals, each having a given frequency. The different frequencies generated by the frequency synthesizer are defined across a band of possible frequencies and may be separated by a constant frequency interval. Thus, a frequency synthesizer may be used to variably select a desired or target frequency from among a plurality of frequencies defined over a relatively wide band of frequencies.

To accomplish this selection and generation of an output signal having a target frequency, the frequency synthesizer may divide its relatively wide band of possible frequencies into a plurality of narrower frequency bands. These relatively narrow frequency bands may be distinguished from one another during a selection procedure in accordance with corresponding channel codes. Thus, when the frequency synthesizer is instructed (or controlled) to generate an output signal having a target frequency, it may first select a corresponding channel code that determines a narrow frequency band from among the plurality of narrow frequency bands that captures (or is closest to) the target frequency, and thereafter lock to the target frequency within the determined narrow frequency band.

However, when an errant channel code is determined during a first step of this two step process, the frequency synthesizer may thereafter be unable to properly lock the output signal to the target frequency—at least without recourse to some external error correction measures (e.g., external channel code error detection and correction circuitry) or a lengthy channel code search routine. Such outcomes greatly diminish the responsiveness of the frequency synthesizer and impair overall system performance.

SUMMARY

Frequency synthesizers and method of controlling a frequency synthesizer according to embodiments of the inventive concept avoid the circumstances wherein an erroneously determined channel code precludes or 'hangs-up' the generation of an output signal having a desired target frequency.

In one embodiment, the inventive concept provides a frequency synthesizer including; an oscillator that generates an oscillation frequency corresponding to a channel code, a frequency decider that determines the channel code on the basis of the oscillation frequency and a reference value corresponding to a target frequency, and corrects the channel code upon determining an error in the channel code, and a phase locker that fine tunes the oscillation frequency to the target frequency.

In another embodiment, the inventive concept provides a frequency synthesizer that provides an output signal having a target frequency and includes; a voltage control oscillator (VCO) that generates the output signal, a first tuning loop that coarse tunes the output signal to an intermediate frequency in response to a channel code selected on the basis of the target frequency, wherein the first tuning loop is configured to correct an error in a determination of the channel code during the coarse tuning, and a second tuning loop that fine tunes the output signal from the intermediate frequency to the target frequency following completion of the first tuning loop.

In another embodiment, the inventive concept provides a frequency synthesizer including; a voltage control oscillator (VCO) that generates the output signal across a range of frequencies including a plurality of intermediate frequencies, wherein the plurality of intermediate frequencies correspond one-for-one with a plurality of channel codes, a frequency decider that, upon receiving an instruction identifying a target frequency for the VCO, controls a coarse tuning step of the VCO, such that the VCO generates an output signal having a desired intermediate frequency among the plurality of intermediate frequencies, wherein the coarse tuning step generates a comparison signal by comparing a reference value corresponding to the target frequency and an output signal indicative of the output signal and generates a correction signal by determining whether a difference value between the reference value and the output value exceeds a stage range value, such that the frequency decider traverses a binary search tree generated in accordance with the plurality of channel codes in response to the comparison signal and the correction signal.

In another embodiment, the inventive concept provides a method controlling operation of a frequency synthesizer, including; generating an oscillator output signal in response to a channel code selected on the basis of a target frequency for the output signal, comparing a reference value corresponding to the target frequency and an output value generated from the output signal to generate a comparison signal, determining a bit of the channel code in response to the comparison signal, generating a difference value between the output value and the reference value, upon determining that the difference value exceeds a stage range value, generating a correction signal indicating that the determined bit of the channel code is an error bit.

In another embodiment, the inventive concept provides a method of controlling the operation of a frequency synthesizer, including; generating an oscillation frequency in response to a channel code, determining the channel code on the basis of the oscillation frequency and a reference value corresponding to a target frequency, during the determining of the channel code, correcting the channel code upon determining an error in the channel code.

In another embodiment, the inventive concept provides a method of tuning an output signal having a desired target frequency and generated by a voltage controlled oscillator (VCO) of a frequency synthesizer, the method including; determining a reference value corresponding to the target frequency, selecting a channel code from among a plurality of channel codes in view of the target frequency, and using a binary tree search to confirm the channel code, wherein at least one stage of the binary tree search determines whether a difference value between the reference value and an output value indicative of the output signal exceeds a stage range value.

In another embodiment, the inventive concept provides a method controlling coarse tuning of a voltage controlled oscillator (VCO) generating an output signal having a desired target frequency, the method including; in response to the target frequency, setting a reference value, generating a comparison signal by comparing the reference value and an output signal indicative of the output signal, generating a correction signal by determining whether a difference value between the reference value and the output value exceeds a stage range value, and traversing a binary tree search generated in accordance with the plurality of channel codes in response to the comparison signal and the correction signal to confirm a final channel code.

BRIEF DESCRIPTION OF THE DRAWINGS

The above and other objects, features and advantages of the inventive concept will become more apparent from the following detailed description when taken in conjunction with the accompanying drawings in which.

DETAILED DESCRIPTION

Figure 1:
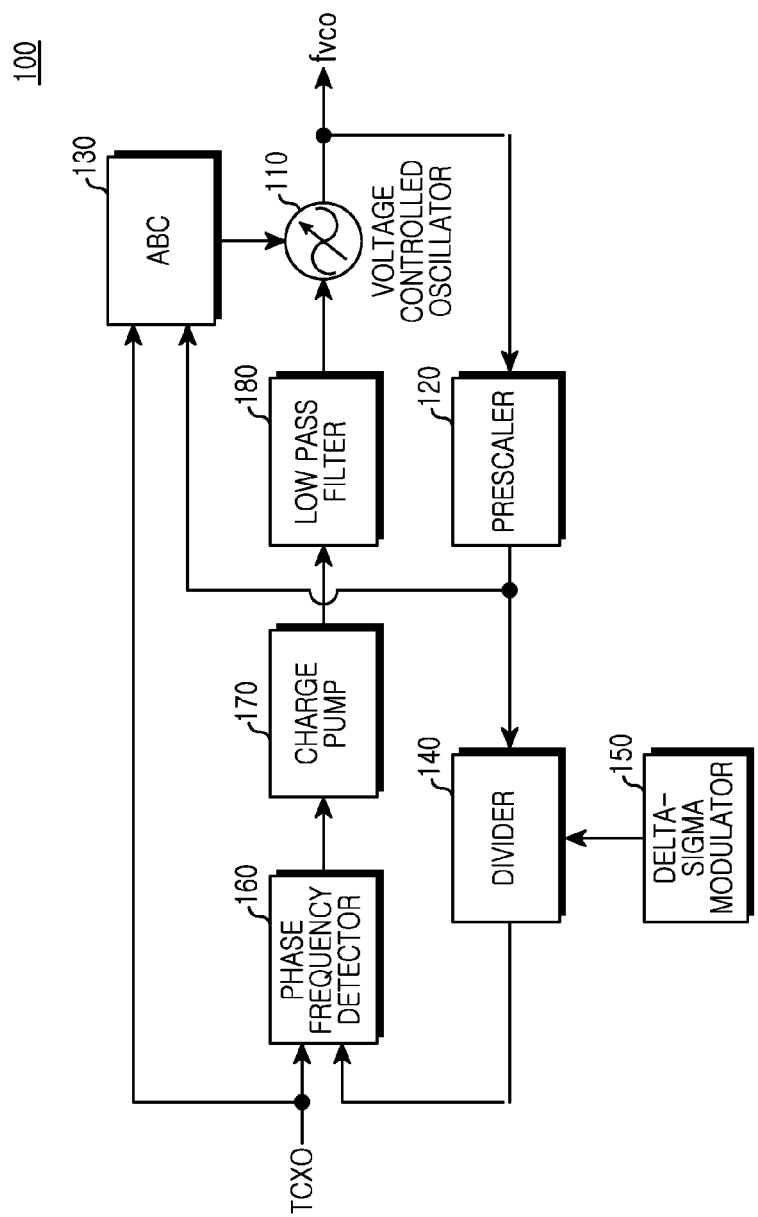
FIG. 1 is a block diagram illustrating a frequency synthesizer according to an embodiment of the inventive concept.

Embodiments of the inventive concept will now be described in some additional detail with reference to the accompanying drawings. However, the scope of the inventive concept is not limited to only the illustrated embodiments but extends to many modifications, extension and alternate constructions thereof. In describing the inventive concept, well-known functions or constructions may not fully be described, as they are deemed to be understood by those skilled in the art. Throughout the written description and drawings, like reference numbers and labels are used to denote like or similar elements.

The expressions "comprise", "may comprise" or the like usable in the various embodiments of the inventive concept indicate the existence of disclosed corresponding functions, operations, constituent elements or the like, and do not limit additional one or more functions, operations, constituent elements or the like. Also, it should be understood that the terms "comprise", "have" or the like in the various embodiments of the inventive concept are to designate the existence of features stated in the specification, numerals, steps, operations, constituent elements, components, or a combination of them, and are not to previously exclude a possibility of existence or addition of one or more other features, numerals, steps, operations, constituent elements, components, or combinations of them.

The expressions such as "or" and the like in the various embodiments of the inventive concept include any and all combinations of words enumerated together. For example, "A or B" may include A, may include B, or may also include all A and B.

The expressions such as "first", "second", etc. used in the various embodiments of the inventive concept may modify the various constituent elements of various embodiments, but do not intend to limit the corresponding constituent elements. For example, the expressions do not limit the order and/or importance and the like of the corresponding constituent elements. The expressions may be used to distinguish one constituent element from another constituent element. For example, all of a first user device and a second user device may be user devices, and represent different user devices. For example, a first constituent element may later be named a second constituent element without departing from the scope of various embodiments of the inventive concept.

When it is said that an element is "coupled" or "connected" to another element, the element may be directly coupled or connected to the other element, but it should be understood that one or more intervening element(s) may exist between the element and the other element. In contrast, when it is said that an element is "directly coupled" or "directly connected" to another element, it will be understood that no intervening elements exist between the element and the other element.

The terms used in the various embodiments of the inventive concept are used in the context of specific embodiments, and do not intend to necessarily limit other embodiments of the inventive concept. Unless defined otherwise, all the terms used herein including the technological or scientific terms have the same meaning as those commonly understood by a person having ordinary knowledge in the art to which the various embodiments of the inventive concept pertain. The terms as defined in a general dictionary should be interpreted as having the same meanings as the contextual meanings of a related technology, and are not interpreted as having ideal or excessively formal meanings unless defined clearly in various embodiments of the inventive concept.

Various apparatuses and methods for controlling the output of a frequency synthesizer will be described hereafter. As will be understood from the following description, frequency synthesizers and methods of controlling frequency synthesizers according to the inventive concept are not susceptible to the generation of an erroneous channel code during a coarse tuning loop of an overall tuning process that generates an output signal having a target frequency. For convenience of description, a frequency synthesizer (or constituent oscillator of a frequency synthesizer) will be said to generate a "frequency", an "oscillation frequency", or certain specific type of frequency, rather than necessarily saying that the frequency synthesizer generates an output signal having the frequency. Those skilled in the art understand the description of "frequency" or "frequencies" presented hereafter inherently assumes one or more intermediate or output signals characterized by the frequency.

FIG. 1 is a block diagram illustrating in one example a frequency synthesizer 100 according to an embodiment of the inventive concept.

The frequency synthesizer 100 is exemplary of a class of devices that may be used to generate an output signal having a desired target frequency. This target frequency may be selected from a range or plurality of frequencies capable of being generated by the frequency synthesizer, wherein adjacent frequencies across the range are separated by a constant interval. This type of frequency synthesizer may be included in various mobile systems, such as in conjunction with a Radio Frequency Integrated Circuit (RFIC).

Here, the frequency synthesizer 100 comprises a Voltage Controlled Oscillator (VCO) 110, a prescaler 120, an Auto Bank Calibration (ABC) unit 130, a frequency divider 140, a Delta-Sigma modulator 150, a phase frequency detector 160, a charge pump 170, and a low pass filter 180. With this configuration, those skilled in the art will recognize that the frequency synthesizer 100 essentially comprises the VCO 110 controlled by a Phase Locked Loop (PLL) circuit, such that the VCO 110 precisely generates an output signal having a target frequency. That is, the PLL circuit is used to "lock" with a feedback loop the target frequency of the desired output signal generated by the VCO 110 in order to provide the output signal with a highly stable frequency.

In this context, those skilled in the art will further recognize that the VCO 110 may be variously implemented and controlled in its operation using a variety of methods. For example, the VCO 110 may be implemented as an inductor (L) and Capacitor (C) ("LC") tank circuit, and controlled using an LC tank oscillation method that changes the oscillation frequency of the VCO across a relatively wide frequency range. In one more particular example, a control method may be used that changes only an input voltage applied to a varactor of the LC tank circuit having a fixed inductance and a variable capacitance. Using this method, the capacitance may be varied to obtain a relatively large VCO gain, albeit at the price of relatively high power consumption and phase noise.

To avoid these potentially negative effects (e.g., high power consumption and phase noise), certain control methods effectively divide the wide frequency band supported by the VCO 110 into a plurality of narrow frequency bands (or "intermediate frequency bands"). Thereafter, by changing the input voltage applied to a varactor associated with only one of the relatively narrow frequency bands, power consumption and phase noise may be reduced due to the relatively small VCO gain associated with the relatively narrow frequency band.

In methods that effectively divide a VCO frequency band into a plurality of narrow frequency bands, the changing of the input voltage applied to the varactor of a narrow frequency band may be accomplished within the VCO 110 by adjusting its constituent capacitance, thereby varying its resonance frequency to select in a controlled manner one of the narrow (intermediate) frequency bands from among the plurality of narrow frequency bands extending across the VCO frequency band. As a result, the VCO 110 may be tunable across a wide range of frequencies, yet the noted adverse consequences (e.g., high power consumption and phase noise) may be avoided by use (e.g.,) of a capacitor bank array including selectable capacitors of varying size.

However, this approach is not without its own drawbacks. For example, the precise definition of many intermediate frequencies requires the use of many precision capacitors in the capacitor bank array. This tends to drive the physical size of the capacitor array upwards. Hence, to reduce the area occupied by the capacitor bank array and generally reduce the number of required capacitors, the capacitor bank array may be implemented using a binary weighted array approach. As a result, a great range of desired capacitances may be realized according to various combinations of capacitors provided by the capacitor bank array. This may be accomplished by selectively connecting and disconnecting particular capacitors within a capacitance-defining circuit (e.g., a parallel circuit of capacitors having different capacitances) of the VCO 110. Here, each selectable capacitance provided by the capacitor bank array may be uniquely associated with a corresponding narrow frequency band, such that each combinatorial selection of capacitors—as defined by a corresponding capacitor back code or "channel code"—effectively determines a corresponding intermediate frequency for the VCO 110. Once the appropriate intermediate frequency has been determined in relation to a target frequency, the output of the frequency synthesizer may be further tuned using (e.g.,) the PLL (e.g., the combination of prescaler 120, divider 140/delta-sigma modulator 150, phase frequency detector 160, charge pump 170, low pass filter 180, and VCO 110) of FIG. 1.

Thus, tuning of the frequency synthesizer 100 may be understood as including two general steps; an initial coarse tuning step, followed by a fine tuning step, where the coarse tuning step comprises the determination and application of an appropriate channel code to the VCO in order to select a corresponding intermediate frequency.

With reference to FIG. 1, a coarse tuning step may functionally disengage the PLL and tune the output frequency of the VCO 110 using a coarse tuning loop that extends from the output of the VCO 110 through the prescaler 120 to the ABC unit 130 to select (or "set") a channel code associated with a desired intermediate frequency band. Once the desired intermediate frequency band has been selected by the channel code, the PLL is functionally reengaged and further fine tuning of the VCO output is performed.

A number of different approaches may be used to determine (or decide upon) a desired channel code. One possible approach uses one or more binary tree search(es) to identify a desired channel code from a group of possible channel codes respectively associated with a plurality of intermediate frequencies. For example, the frequency synthesizer may receive information indicating a desired target frequency and select a channel code most appropriate to (or "in response to") the indicated target frequency. For example, a particular intermediate frequency band may be selected because it is includes the target frequency, or is closest to the target frequency, etc. The selected channel code may then be applied to circuitry, such as the ABC unit 130, that controls the coarse tuning of the VCO 110. Here, coarse tuning may include generating a frequency, comparing the generated frequency to the desired intermediate frequency indicated by the selected channel code, and then iteratively adjusting (increasing and/or decreasing) the generated frequency until it substantially equals the intermediate frequency.

For example, assuming that the ABC unit 130 includes a capacitor bank array a sequence of frequency comparisons may be used to select/de-select respective capacitors in the capacitor bank array to control the generation of a desired intermediate frequency. Ultimately, a final channel code is determined by the ABC unit 130 that controls the selection of an intermediate frequency during the coarse tuning step.

As with the coarse tuning step the fine tuning step may be variously performed. Extending the example illustrated in FIG. 1, the fine tuning step may connect the PLL feedback loop to the VCO 110, such that the PLL circuit further adjusts the intermediate oscillation frequency until it becomes phase synchronous with the target frequency. For example, the prescaler 120 of FIG. 1 is a circuit that scales a frequency for the purpose of frequency matching between a high speed signal and a corresponding low speed signal that may exist in different portions of the PLL circuit. To facilitate a comparison between a generated frequency (i.e., the frequency generated by the VCO 110) and a reference signal (e.g., a frequency generated by a Temperature-Compensated X-tal Oscillator, TCXO), the prescaler 120 may be used to reduce the oscillation frequency by some set rate. The divider 140 may then be used to further decrease the frequency of the signal provided by the prescaler 120 to a level compatible with that of the reference signal. Here, the frequency of the output signal provided by the combination of the prescaler 120 and divider 140 may be controlled by the Delta-Sigma modulator 150, such that the frequency of the signal provided to the phase frequency detector 160 is a unit multiple of the reference signal, for example.

With these input signals, the phase frequency detector 160 detects a difference (frequency and/or phase) between the reference signal and the frequency-adjusted output signal generated by the VCO 100. That is, the phase frequency detector 160 may be used to quantitatively calculate a difference between a waveform for the signal provided by the divider 140 and a waveform for the reference signal in order to generate a waveform comparison signal representing the detected waveform difference. This waveform comparison signal is passed through the combination of the charge pump 170 and low pass filter 180 in order to generated a control current corresponding to the waveform comparison signal provided by the phase frequency detector 160. This control current may then be used to fine tune the frequency of the output signal provided by the VCO 110.

The foregoing approach (e.g., using a binary tree search to set a channel code controlling the selection of an intermediate frequency during a coarse tuning step) may be used to tune the output of a VCO in a frequency synthesizer works relatively well, at least until it does not. Namely, when an erroneous channel code—one caused by a channel code bit flip due to noise effects, for example—is applied to the ABC unit 130 and where the erroneous channel code is sufficiently different from the target frequency, the VCO tuning process may stall or lock-up, effectively forcing a disruptive channel code error correction operation.

Figure 2:
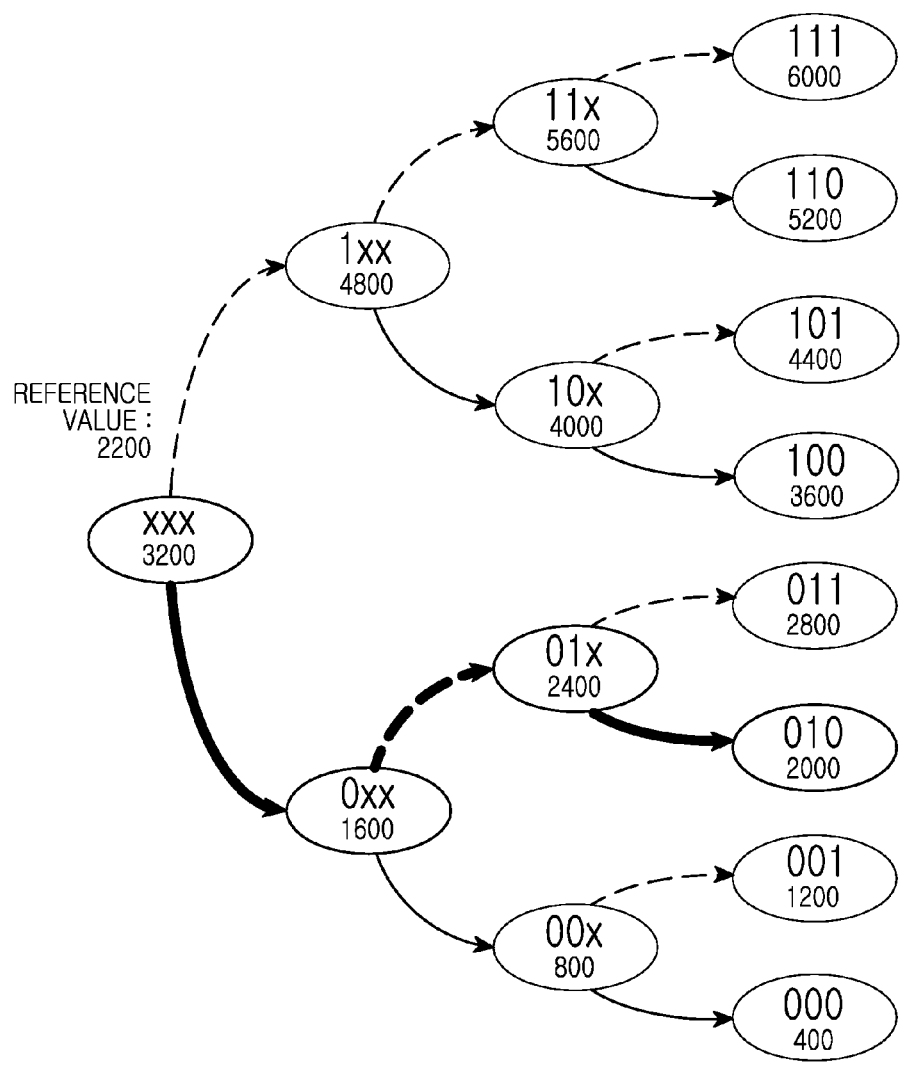
FIGS. 2 and 3 are respective conceptual diagrams illustrating examples of binary tree search routines used to determine a channel code in a frequency synthesizer according to an embodiment of the inventive concept.
Figure 3:
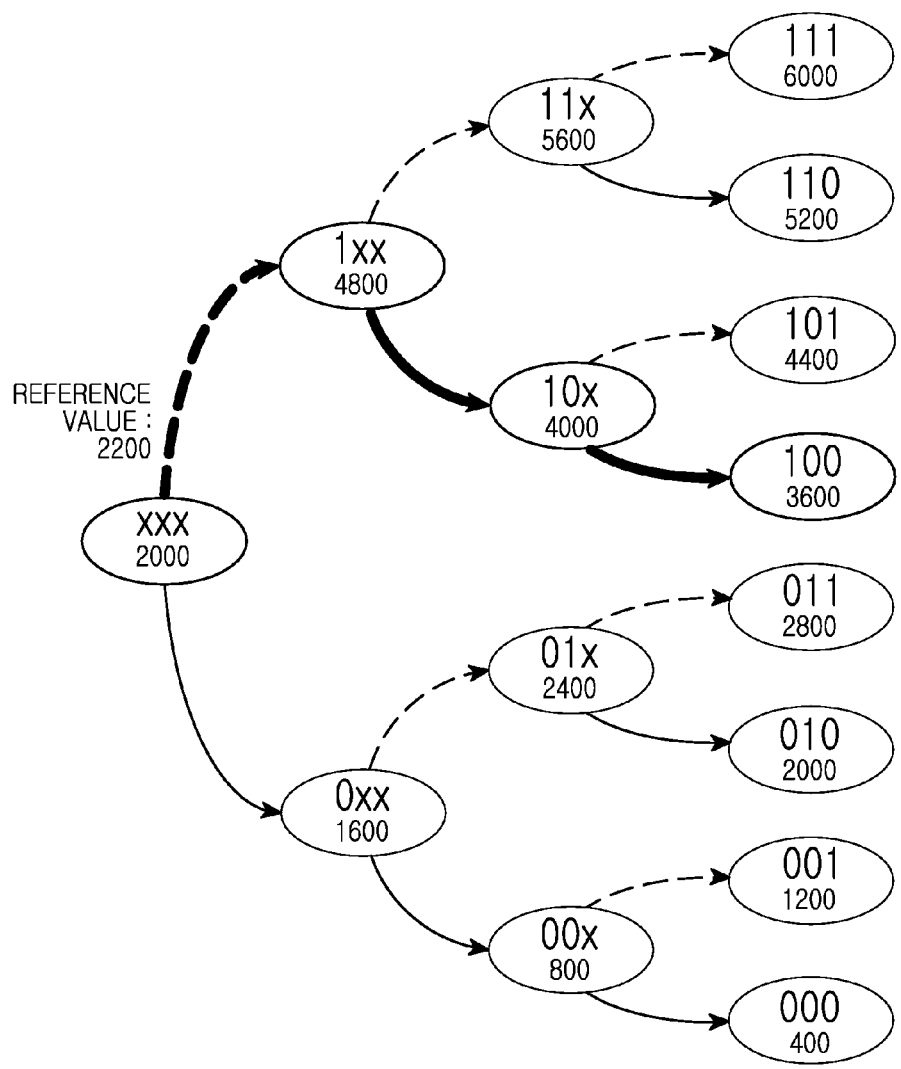

FIGS. 2 and 3 are comparative conceptual examples that illustrate the effects of an erroneous channel code on frequency synthesizers. Here, a simple 3-bit channel code is assumed, but those skilled in the art will recognize that channel codes consistent with embodiments of the inventive concept may be longer (e.g., 7 or 8 bits) and differently derived using different binary search routines.

FIG. 2 conceptually illustrates a successful determination of a channel code during a coarse tuning step. During a coarse tuning step, a channel code controlling the output of the VCO 110 may be determined (or set), and then, a resulting generated frequency corresponding to the channel code may be detected. The generated frequency may be variously detected. For example, a counter or similar device may be use to "count" a number of output signal periods occur during an arbitrary time interval (hereafter, a "detection interval"). By then comparing a resulting "count value" with a "reference value" corresponding to the target frequency, a binary tree of possible channel code values may be logically traversed until a desired channel code is identified. Here, the binary tree may be searched in accordance with a bitwise comparison value for each bit of the channel code until the coarse tuning process is complete.

Thus, with reference to FIGS. 1 and 2, a reference value (e.g., 2200) is selected in response to a desired target frequency, whereas an arbitrary (e.g., a default or initial) channel code is applied by the ABC unit 130 to control the output of the VCO 110. A comparison of resulting count value and reference value is made by the phase frequency detector 160 as previously described. Here, it is assumed that if the count value—which corresponds to the frequency of the output signal provided by the VCO 110—is greater than the reference value, then a first bit of the channel code is determined to be a '0'. Alternately, if the count value is less than the reference value, the first channel code bit is determined to be a '1'. In this manner, a binary tree comprising possible channel code values is traversed on a bit-by-bit basis until a complete (or final) channel code is determined. This final channel code is then applied to the VCO 110 to define a corresponding intermediate frequency for the coarse tuning step.

Thus, the binary tree, including possible channel code values 000, 001, 010, 011, 100, 101, 110, and 111, conceptually illustrated in FIG. 2 is bit-by-bit traversed from a most significant (e.g., a first) bit to a least significant (e.g., a last) bit according to respective comparisons of a count value and a reference value. Hereafter, each bit-related, binary tree traversing comparison may be referred to as a binary tree search comparison "stage".

Thus, is a first stage of the binary tree search, a reference value of 2200 corresponding to a target frequency is compared with a count value resulting from an initially set channel code (e.g., 3200). Here, an initial channel code (e.g., 100) is selected since it is approximately midway between a lowest channel code 000 corresponding to a nominal count value of 400, and a highest channel code 111 corresponding to a nominal count value of 6000. Since the count value 3200 under these assumptions is greater than the reference value 2200, the first bit of the channel code is set to '0' and the first stage of the binary tree search is complete. In this regard it should be noted that the count value is not necessarily a fixed value exactly equal to current output frequency of the VCO 110. Rather, the count value will vary according to a variety of external conditions, including for example, the operating temperature of the frequency synthesizer 100, one or more operating voltages applied to the frequency synthesizer 100 and/or VCO 110, and/or variations in the fabrication processes used to form certain circuits or circuit elements within the frequency synthesizer 100 (hereafter, singularly of collectively "PVT variations").

With the first bit of the channel code set to '0', a second stage of the binary tree search is executed. Here, it is assumed that a first updated channel code (i.e., a code resulting from a change in the initial channel code caused by execution of the first stage to the first updated channel code beginning with a first bit of '0') results in a count value of 1600 that is less than the reference value of 2200. Accordingly, the second bit of the channel code is determined to be a '1'.

Similarly, with the second bit of the channel code set to '1', a third stage of the binary tree search is executed. Here, it is assumed that a second updated channel code (i.e., a code resulting from a change in the first updated channel code caused by execution of the second stage to the second updated channel code beginning with a first bit of '0' and a second bit of '1') results in a count value of 2400 that is greater than the reference value of 2200. Accordingly, the third and last bit of the channel code is determined to be a '0'.

The respective choice of the first updated and second updated channel codes may be arbitrarily made, albeit according to the information derived from all previously executed binary tree search stages. For example, following the determination by the first stage that the first bit of the channel code is '0', the only possible final channel code values become 000, 001, 010 and 011. Thus, the first updated channel code might be a channel code approximately midway between the lowest possible channel code 000 and the highest channel code 011 (e.g., 001 or 010). Similarly, following the determination by the first and second stages that the first bit of the channel code is '0' and the second bit of the channel code is '1', the only possible final channel code values become 010 and 011. Thus, the second updated channel code is one selected between 010 and 011.

In this manner, the binary tree search (or binary tree traversing routine) illustrated in FIG. 2 will generate a final channel code of 010 nominally corresponding to a VCO output frequency corresponding to a count value of 2000 that is correctly identified as being closest to the target frequency corresponding to the reference value of 2200. Hence, the final count value of 010 is appropriate and the coarse tuning step is successfully completed. Further, given the nearness of the appropriately selected intermediate frequency corresponding to the final channel code 010 determined by the example of FIG. 2, a subsequently executed fine tuning step using the PLL circuit of FIG. 1 may quickly and effectively further tune the intermediate frequency to the desired target frequency. However, this is not the case for the erroneous outcome of the binary tree search routine illustrated in FIG. 3.

FIG. 3 conceptually illustrates a unsuccessful determination of a channel code during a coarse tuning step.

The same assumptions made with respect to the example of FIG. 2 are ascribed to the example of FIG. 3. However, due to PVT variations and/or noise effects (e.g., a metastability phenomenon causing erroneous operation of a counter providing the count value, or erroneous indication by a data latching flip-flop, etc.), the first stage of the binary tree search erroneously determines that the first bit of the channel code is '1', instead of the correct value '0'. That is, despite again assuming a reference value of 2200, the first binary tree search stage determines that the first bit value of '1' due to an erroneous count value of 2000 being provided to the phase frequency detector 160. As a result, the first stage determines that the first bit of the channel code is a '1'.

The magnitude of this error associated with a most significant bit of the channel code being determined proves fatal in the example of FIG. 3, because even when the subsequent second and third stages are properly executed, the resulting final channel code of 100 is still relatively distant from the appropriately-determined, final channel code of 010. And since the resulting intermediate frequency selected by the erroneous final channel code is so far from the desired target frequency, the PLL circuit of FIG. 1 may not be able to sufficiently fine tune the intermediate frequency to generate the target frequency. Hence, the failure of the coarse tuning step to appropriately select an intermediate frequency precludes the frequency synthesizer 100 from generating the desired target frequency, despite proper operation of the PLL. That is, the frequency synthesizer may fail to lock on the target frequency due to failure of the coarse tuning step to correctly select a channel code.

Failure by the frequency synthesizer to lock on a target frequency usually precludes the host device from properly operating. Accordingly, some circuit or controller (e.g., a modem) external to the frequency synthesizer must detect the "lock state" of the frequency synthesizer, and then upon determining that the lock state is a lock fail state, force some corrective measure (e.g., a complete re-determination of the intermediate and target frequencies, or a linear (value-by-value) search through all possible channel codes, etc.). Such externally applied lock state detection and lock fail state corrective measures are slow and resource consuming, thereby impeding the overall performance of the host device incorporating the frequency synthesizer, and degrading a user's experience.

Recognizing the possibility of a frequency synthesizer failing to lock due to an erroneous determination of a channel code and the highly undesirable corrective measures used by contemporary host devices incorporating frequency synthesizers, embodiments of the inventive concept provide frequency synthesizers and/or methods of operating (or controlling the operation of) frequency synthesizers that ensure appropriate determination of a channel code that selects an appropriate intermediate frequency during a course tuning step without external monitoring and possible correction of the channel code and/or intermediate frequency. As a result, frequency synthesizers according to embodiments of the inventive concept are more reliable, less likely to enter a lock fail state, and do not require the intermediation of an external monitoring and control signal relative to the determination of a channel code during a coarse tuning step.

Figure 4:
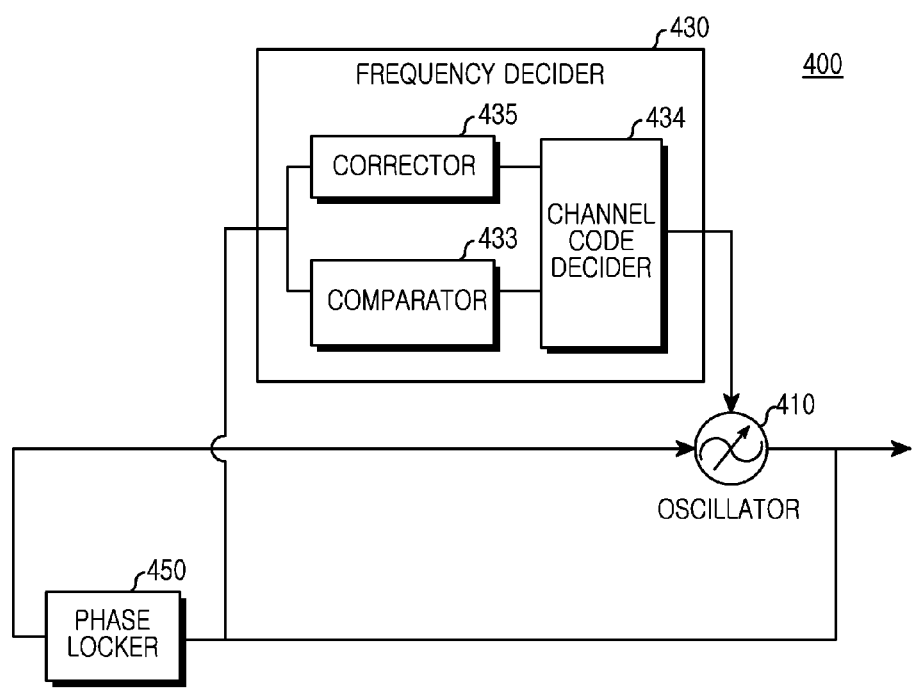
FIG. 4 is a block diagram illustrating a frequency synthesizer according to an embodiment of the inventive concept.

FIG. 4 is a block diagram illustrating a frequency synthesizer 400 according to an embodiment of the inventive concept.

Referring to FIG. 4, the frequency synthesizer 400 controls the generation of an output signal by an oscillator 410, where the frequency of the output signal is variable (e.g., according to a set frequency interval) across a relatively wide frequency band. In addition to the oscillator 410, the frequency synthesizer 400 generally comprises a frequency decider 430 and a phase locker 450.

The oscillator 410 may be variously implemented as, for example, a voltage controlled oscillator (VCO). The frequency decider 430 generally controls the determination of the frequency of the output signal provided by the oscillator 410. In the illustrated example of FIG. 4, the frequency decider 430 comprises a comparator 433, a channel code decider 434, and a corrector 435, where in certain embodiments of the inventive concept, the frequency decider 434 is implemented as the Auto Bank Correction (ABC) unit 130 of FIG. 1.

The phase locker 450 may be implemented in certain embodiments of the inventive concept as a phase locked loop (PLL) circuit. As with the example described in relation to FIG. 1, the phase locker 450 may be used during a fine tuning step to "lock" onto a target frequency and provide a highly frequency-stable output signal. Thus, in certain embodiments of the inventive concept, the phase locker 450 may include the prescaler 120, divider 140, Delta-Sigma modulator 150, phase frequency detector 160, charge pump 170, and low pass filter 180 of FIG. 1.

Setting aside for the moment the fine tuning step functionality of the phase locker 450, the oscillator 410 is controlled in such a manner that the ultimate generation of a target frequency begins by the generation of an intermediate (oscillation) frequency corresponding to a selected channel code. As before in order to efficiently support a wide frequency band, the oscillator 410 may divide the wide frequency band into a plurality of narrow frequency bands, operationally select a specific frequency band among the plurality of narrow frequency bands, and then generate an intermediate frequency corresponding to the selected, narrow frequency band. The division of the wide frequency band and selection of a narrow frequency bands may be variously accomplished. However, in certain embodiments of the inventive concept, the oscillator 410 will include a capacitor bank array including capacitors of different sizes. The narrow frequency bands may be respectively defined in accordance with varying combinations of these capacitors. That is, variously determined (e.g., switch controlled inclusion/exclusion) combinations of the capacitors arranged in the capacitor bank array may be determined by application of a selected channel code, where the resulting capacitance defines the intermediate frequency of the output signal generated by the oscillator 410.

Thus, in the illustrated embodiment of FIG. 4, the frequency decider 430 will be used to iteratively (e.g., binary tree search stage-by-stage) determine a final channel code in response to the oscillation frequency of the oscillator 410, as controlled by a sequentially updated channel code and in response to a desired target frequency. However, unlike other frequency synthesizers described above, the frequency synthesizer 400 of FIG. 4 is able to internally detect error(s) in a channel code during its determination and correct any detected error(s) without the intervention of an external control circuit.

For example, the comparator 433, that may be implemented as a binary comparator, may be used to execute a stage-by-stage binary tree search by comparing for each stage an "output value" for the oscillator 410 and a reference value selected in response to the target frequency. Here, the output value for the oscillator 410 may be a count value generated by a counter in response to a generated frequency of the oscillator 410. During each binary tree search comparison stage, the comparator 433 will provide a "comparison signal" to the channel code decider 434.

In response to the comparison signal, the channel code decider 434 determines on a bit-by-bit basis, for example, a final channel code. Thus, consistent with the foregoing description, if the output value for the oscillator 410 is determined to be greater than the reference value, the resulting comparison signal will cause the channel code decider 434 to determine that the bit being determined in the current binary tree search stage should be a '0', or if the output value for the oscillator 410 is determined to be less than the reference value, the resulting comparison signal will cause the channel code decider 434 to determine that the bit being determined in the current binary tree search stage should be a '1'.

Under these assumptions, those skilled in the art will understand that the combination of the comparator 443 and channel code decider 434 of the frequency decider 430 shown in FIG. 4, may be used to effectively execute the channel code determination method described in FIG. 2. That is, where no errant channel code bit is generated, the stage-by-stage comparison of a reference value (e.g., 2200) with a stage-by-stage updated output value (e.g., 3200, 1600 and 2400) will readily determine an appropriate channel code (e.g., 010) relative to the desired target frequency. This result occurs because the stage-by-stage traversing of the binary tree correctly proceeds in direction such that the updated output value coincides ever more closely with the reference value. Following the example described with reference to FIG. 2, the final channel code 010 determined by the frequency decider 430 is ultimately applied to the oscillator 410 in order to generate an intermediate frequency that is closest among the possible intermediate frequencies to the desired target frequency.

However, in circumstances—like those described in relation to FIG. 3—where an errant channel code bit is generated during the coarse tuning step, the corrector 435 shown in FIG. 4 comes into particular consideration. For example, the corrector 435 may be used to calculate a "difference value" between an output value for the oscillator 410 during a given binary tree search stage and the reference value. If the calculate difference value exceeds a range established for the stage, the corrector 435 will generate a correction signal causing the channel code decider 434 to correct (e.g., flip) the errant channel code bit. Thus, the channel code decider 434 may be understood as determining on a stage-by-stage basis the channel code in response to a comparison signal provided by the comparator 433 and a correction signal provided by the corrector 435. In this context, the comparison signal and the correction signal may be variously defined (e.g., as a high/low toggling control signal, one or more digital bits or flags, a portion of a control data packet, etc.).

Applying the example of FIG. 3 to the embodiments illustrated in FIG. 4, during execution of the first binary tree search stage, the most significant bit is erroneously determined to be a '1'. This determination results, for example, in a first updated output value of 5200 (e.g., a value midway between 3600 and 6000) as compared with the reference value of 2200. Assuming that an appropriate "stage range" (i.e., a 'normal range' associated with a binary tree search stage between an output value and a reference value) is established, the corrector 435 will detect an error in the determination of the bit associated with the current stage. This error may then be corrected by the channel code decider 434. In this regard, respective stage ranges may be empirically determined, and will usually decrease with each successive binary tree search stage, as the channel code being determined converges with the appropriate channel code in view of the target frequency.

As will be described in some additional detail with reference to FIGS. 6, 7, 8 and 9, exemplary stages ranges for the examples described in relation to FIGS. 2 and 3 may include a first stage range of +/−1600. Accordingly, assuming in the foregoing example that a first updated channel code of 110 corresponding to a nominal output value of 5200 is selected based on the determination that the first bit of the channel code is a '1', the corrector 435 will determine that the resulting different value of 3000 (i.e., 5200–2200) exceeds the first stage range of 1600 and therefore a channel code bit error has probably been generated. In response to a corresponding correction signal provided by the corrector 435, the channel code decider 434 may readily correct the channel code bit error.

Different approaches may be used to effective correct a detected error (i.e., one or more bits) in a channel code. All such approaches may be under stood as "nullifying" the determination results of one or more binary tree search stage(s). Thus, in the foregoing example the determination results of a first stage of the binary tree search may be nullified in response to the correction signal provided by the corrector. Nullification may include, for example, completely re-determining the nullified determination result, or merely flipping the bit value of the bit stored in a register of the frequency decider 430 (e.g., the channel code decider 434).

Continuing with the working example illustrated in FIGS. 3 and 4, the channel code decider 434 may nullify the first updated channel code '110' that was determined as the result of the first stage by returning to the initial channel code '100' and re-executing the first stage of the binary tree search. In this manner, the ultimate generation of an erroneous channel code is prevented by inclusion of the corrector 435 that operates in conjunction with the channel code decider 434. Those skilled in the art will recognize that each stage of a binary tree search may have a corresponding stage range assigned to it, and the corrector 435 may be used to generate a difference value for each stage that is then compared with the stage range as an error detection measure in order to define the nature or state of a correction signal.

In regard to the operation of the corrector 435, it is possible that under rare circumstances that the determination of the difference value may in and of itself, or the comparison of the difference value to a stage range may in and of itself be subject to one or more errant data bits. That is, it is possible that a correctly determined, updated channel code may falsely be interrupted as exceeding a corresponding stage range. Under such circumstances, corrective measures involving channel code bit-flipping may actually introduce one or more errors into the channel code being determined during a coarse tuning step. Thus, certain embodiments of the inventive concept may provide one or more additional step(s) directed to the re-execution of the difference value calculation and/or the re-comparison of a (re-) calculated difference value to the stage range whenever a difference value calculation is determined to exceed a stage range. Such a recursive approach to the calculation of a difference value and comparison of the difference value to a stage range will greatly reduce the possibility of introducing one or more channel code bit error(s) due to an erroneously calculated difference value and/or an erroneous comparison of the difference value to a stage range.

Under such provisions, if it is again determined that a difference value exceeds a stage range, the corrector 435 may confidently determine that an error has occurred in a previously executed binary tree search stage, and the corresponding determination result may be nullified, such as by bit-flipping a most recently determined channel code bit. This type of higher confidence error detection, followed by a bit-flipping error correction approach may in some embodiments of the inventive concept be more rapidly performed than a complete re-execution of a channel code determining stage.

In the foregoing embodiments, the reference value provided to the phase frequency detector 160 may be precisely generated using, for example, a Temperature Compensated crystal (X-tal) Oscillator (TCXO). In certain embodiments, the oscillation frequency of the oscillator 410 may be adjusted (up or down) at a constant rate using a device like the prescaler 120. Thereafter, the reference value and an output value (e.g., a count value) derived from the output of the prescaler 120 may be (phase or frequency) compared by the prescaler 120, where the frequency of the output signal provided by the oscillator 410 may be tuned in accordance to an electric current generated by the combination of charge pump 170 and low pass filter 180 receiving a difference signal from the phase frequency divider 160.

Figure 5:
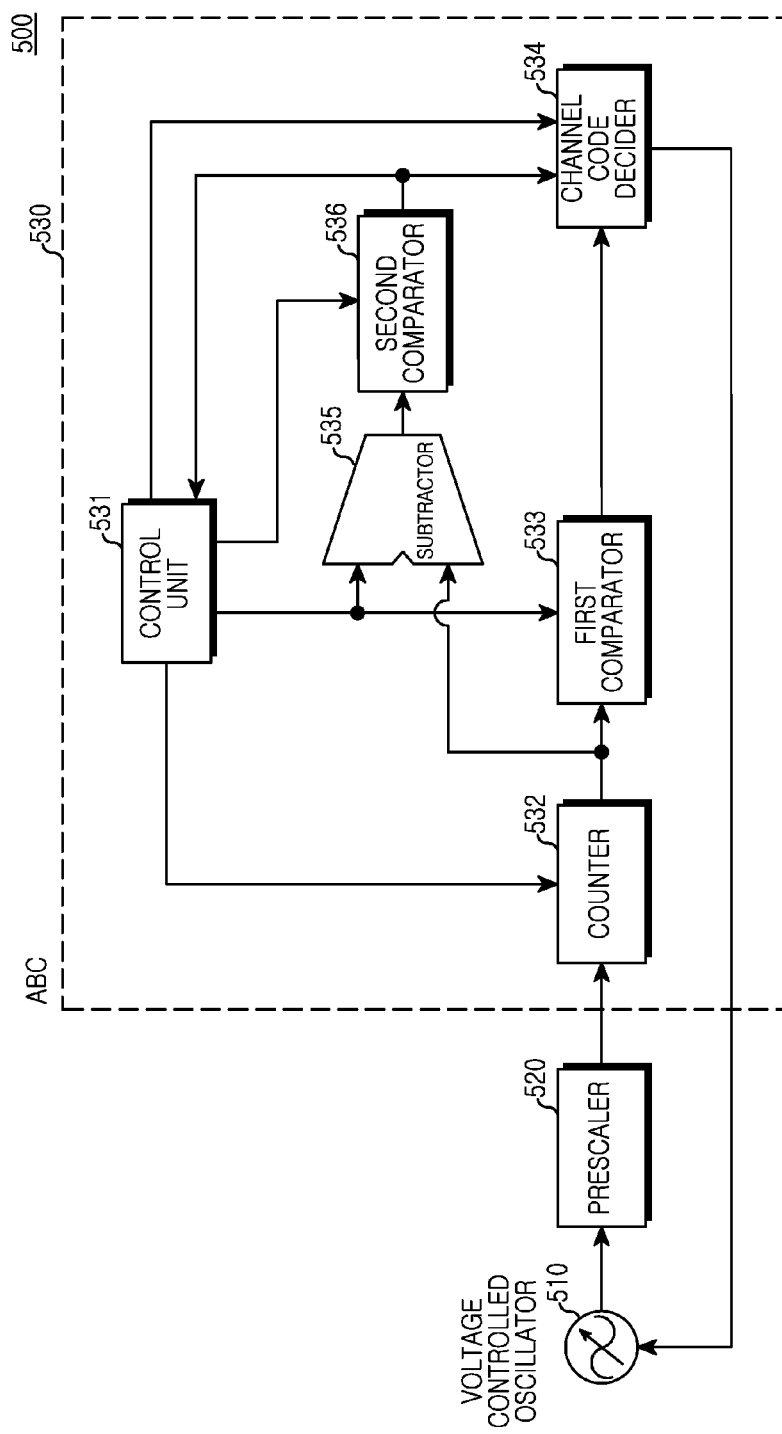
FIG. 5 is a block diagram further illustrating in one example the Auto Bank Calibration (ABC) unit of FIG. 4 according to an embodiment of the inventive concept.

FIG. 5 is a block diagram illustrating a frequency synthesizer 500 according to an embodiment of the inventive concept.

Referring to FIG. 5, the frequency synthesizer 500 is similar in operation and configuration to the frequency synthesizers 100 and 400 of FIGS. 1 and 4, respectively. However, the frequency synthesizer 500 of FIG. 5 further illustrates in one example a frequency decider 530 (e.g., an Auto Bank Calibration or ABC unit) including a control unit 531, a counter 532, a first comparator 533, a channel code decider 534, a subtractor 535, and a second comparator 536.

Here, the counter 532 and first comparator 533 may be included in the binary comparator 433 of FIG. 4. Further, the subtracter 535 and second comparator 536 may be included in the corrector 435 of FIG. 4.

As will be described in some additional detail hereafter, the ABC unit 530 is configured to execute the control functions more generally described in relation to FIG. 4, including the generation of a comparison signal and a correction signal applied to the channel code decider 534. Using this approach, a channel code iteratively (e.g., bit-by-bit) generated by the channel code decider may be used to control the frequency of a voltage control oscillator (VCO) 510. As with the previously described embodiments, the VCO 510 is configured to provide an output signal ranging in frequency across a relatively broad frequency band that has been divided into a plurality of relatively narrow frequency bands (or intermediate frequency bands).

For example, a current output signal provided by the VCO 510 in response to a current channel code controlling the selection of capacitors in a constituent capacitor bank array of the VCO 510 may be passed through a prescaler 520 in order to then be applied a scaled signal of appropriate amplitude and/or frequency to the counter 532. The scaled signal received from the prescaler 520 is counted by the counter 532 during a defined count period to generate a corresponding current count value indicative of the frequency of the current output signal of the VCO 510. The control unit 531 may be used to generate an appropriate control signal controlling the definition of the count period for the counter 532. Thus, during each respective stage of a binary tree search, a current count value is applied to the first comparator 533 and subtractor 535.

In the example of FIG. 5, it is assumed that the control unit 531 provides a reference value generated in response to a target frequency of the VCO output signal to the first comparator 533 and subtractor 535. A comparison of the count value and the reference value by the first comparator 533 generates one possible version of the comparison signal described above, where the comparison signal may then be provided to the channel code decider 534 in order to determine a channel code according to a comparison signal-controlled traversing of the binary tree. That is, the channel code decider 534 may determine one or more channel code bits on the basis of the comparison signal provided by the first comparator 533. For example, if the comparison signal indicates that the count value is greater than the reference value, the channel code decider 534 may decide that a current channel code bit being determined by the current binary tree search stage should be a '0'. Alternately, if the comparison signal indicates that the count value is less than the reference value, the channel code decider 534 may decide that the current channel code bit should be a '1'.

However, unlike many contemporary frequency synthesizers, a frequency synthesizer according to an embodiments of the inventive concept does not merely rely upon an output value (i.e., the count value) and reference value comparison to determine a final channel code. Instead, embodiments of the inventive concept additional provide a correction signal that is capable of nullifying an erroneous channel code bit(s0 determination. And since this channel code error detection and correction may be executed internal to the frequency synthesizer and using a stage by stage channel code determination approach, no significant degradation in frequency synthesizer operations will be experienced due to the errant determination of a channel code selecting the wrong intermediate frequency band during a coarse tuning step.

For example, the subtractor 535 of FIG. 5 computationally subtracts one of the count value received from the counter 532 and the reference value received from the control unit 531 from the other to generate a corresponding difference value for the current stage of the binary tree search. The resulting difference value is then compared in the second comparator 536 with a stage range value defined form the current stage of the binary tree search and provided by the control unit 531. In this manner, the second comparator 536 may generate one possible version of a correction signal that is applied to the channel code decider 534 and/or the control unit 531.

Where the difference signal exceeds the current stage range value, the control unit 531 and/or channel code decider 534 may determine that an error has occurred in the determination of the current channel code bit(s), and therefore, further determine to correct the errant channel code bit(s). Accordingly, so long as the binary tree search progresses in a manner where the output value indicative of the frequency of the VCO output signal converges (according to a stage-by-stage defined range value) with the reference value indicative of a target frequency, the binary tree search proceeds to the next stage until a complete or final channel code is determined. However, where a given stage of the binary tree search results in a diverging result (i.e., a difference value that exceeds a stage range), the results of the current stage of the binary tree search are nullified using one of several possible approaches (e.g., bit flipping, re-determination of one or more channel code bits, re-execution of the one or more binary tree search stages, etc.).

Figure 6:
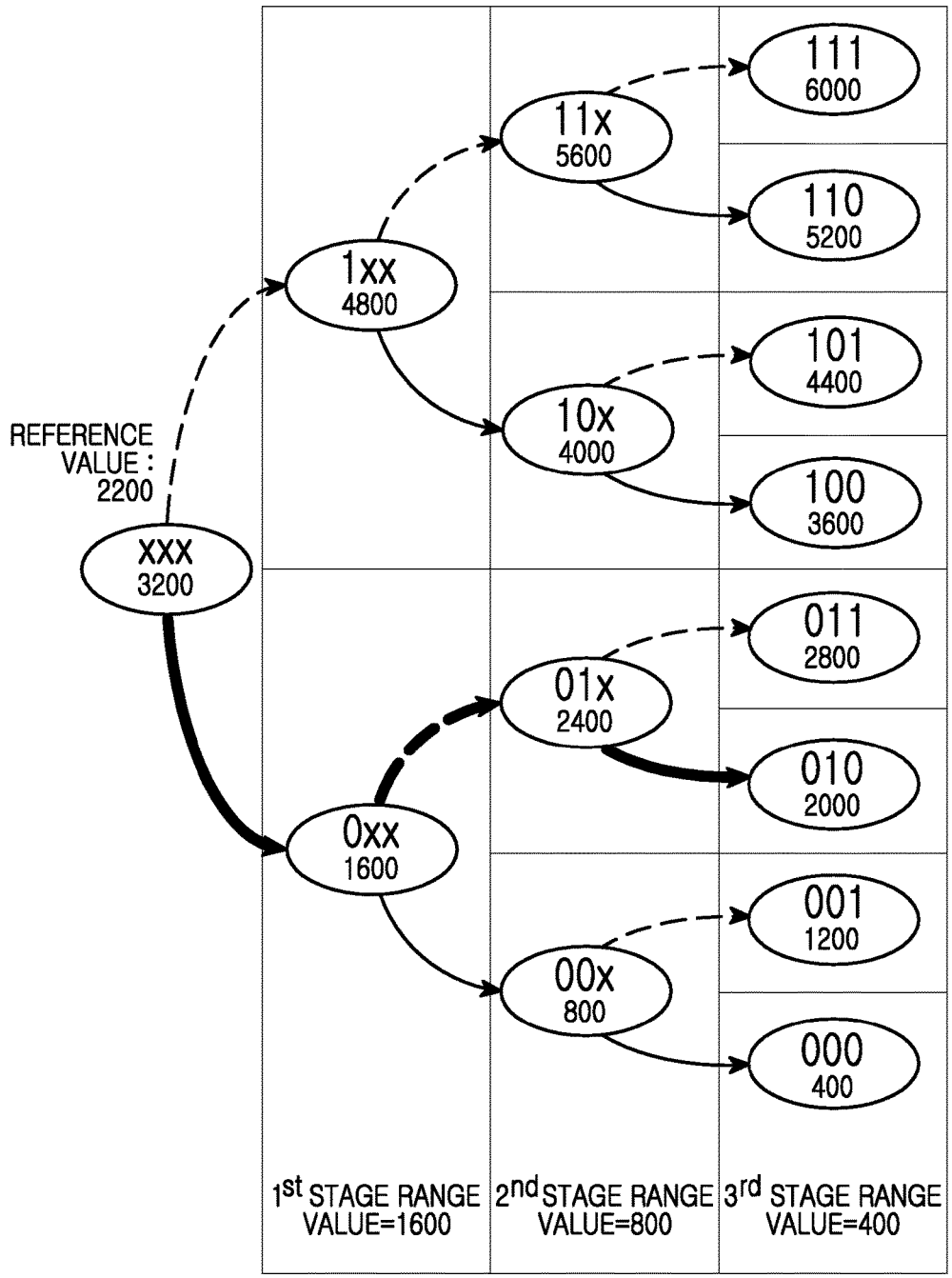
FIGS. 6 and 7 are respective conceptual diagrams illustrating various examples of binary tree search routines used to determine a channel code in a frequency synthesizer according to an embodiment of the inventive concept.
Figure 7:
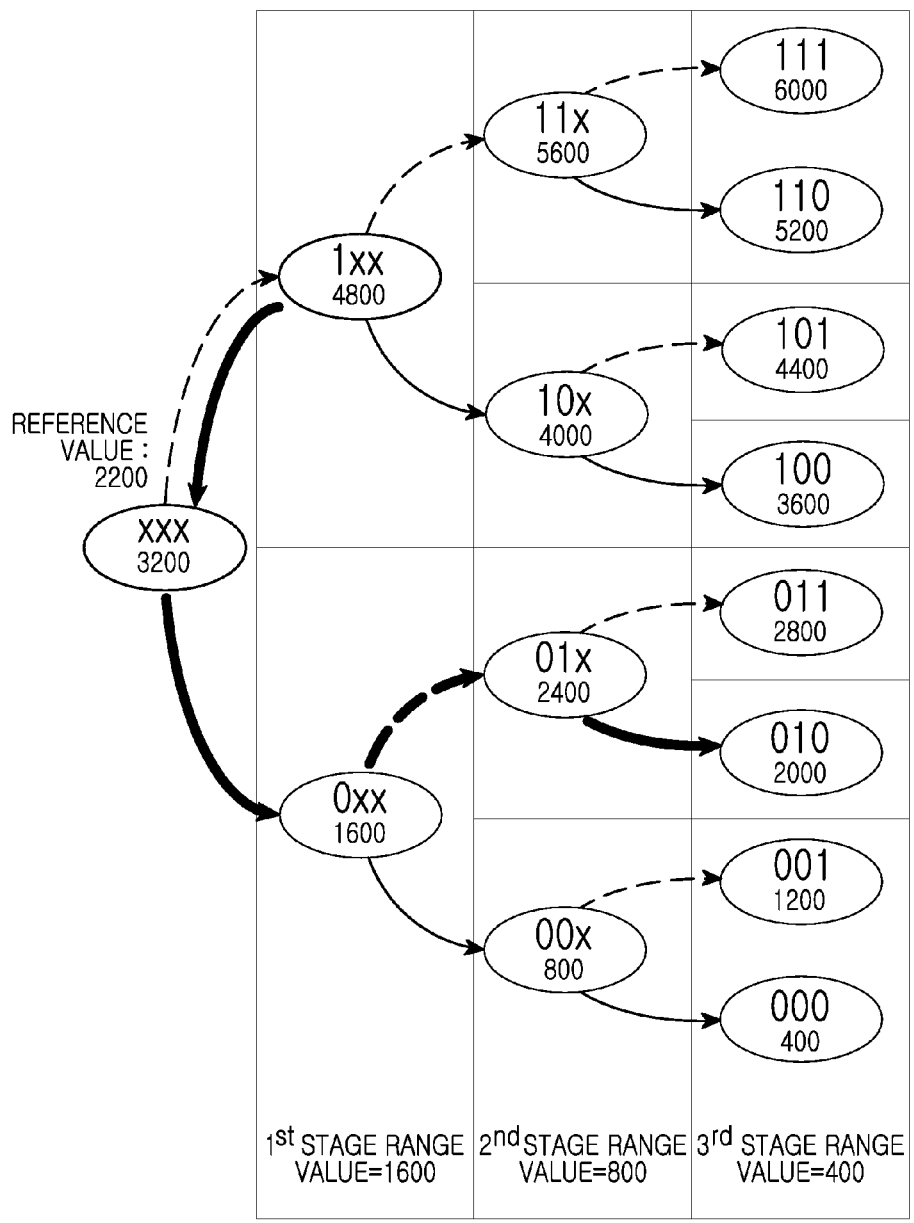

FIGS. 6 and 7 conceptually illustrate two (2) examples of binary tree searches in relation to the embodiment of the inventive concept illustrated in FIG. 5. Here, as before with regard to FIGS. 2 and 3, a 3-bit channel code example is assumed.

FIG. 6 conceptually illustrates an example of a successful (non-errant) binary tree search progression. Similar assumptions are made with respect to FIGS. 5 and 6 as were made in relation to FIGS. 1 and 2. Thus, a reference value of 2200 is assumed to be provided by the control unit 531 to the first comparator 533 and subtractor 535. A first stage range of 1600 is set by the control unit 531 and provided to the second comparator 536, and an initial channel code is selected by the control unit 531 and applied to the channel code decider 534, where this initial channel code results in a corresponding count value of 3200.

Since 3200 is greater than 2200, the resulting comparison signal generated by the first comparator 533 causes the channel code decider 534 to determine that the first bit of the channel code should be a '0'. Further during the first stage of the binary tree search, the difference value generated by the subtractor 535 is 1000 which is less than the defined first stage range of 1600. Therefore, the channel code determination result corresponding to the first stage is deemed to be correct, the channel code unit 534 sets the first bit of the channel code to '0', and the binary tree search proceeds to the second stage. As a result of the non-errant, first stage channel code determination, a first updated channel code—a channel code having a first bit of '0'—is effectively applied to the VCO 510 which in turn generates an output signal having a first updated frequency corresponding to the first updated channel code now stored in the channel code decider 534. Accordingly, the first updated frequency generates a corresponding count value of 1600.

In the second stage of the binary tree search, since 1600 is less than 2200, the resulting comparison signal generated by the first comparator 533 causes the channel code decider 534 to determine that the second bit of the channel code should be a '1'. Further during the second stage of the binary tree search, the difference value generated by the subtractor 535 is 600 which is less than the defined second stage range of 800. Therefore, the channel code determination result corresponding to the second stage is deemed to be correct, the channel code unit 534 sets the second bit of the channel code to '1', and the binary tree search proceeds to the third stage. As a result of the non-errant, second stage channel code determination, a second updated channel code—a channel code having a first bit of '0' and a second bit of '1'—is effectively applied to the VCO 510 which in turn generates an output signal having a second updated frequency corresponding to the updated channel code now stored in the channel code decider 534. Accordingly, the second updated frequency generates a corresponding count value of 2400.

In the third stage of the binary tree search, since 2400 is greater than 2200, the resulting comparison signal generated by the first comparator 533 causes the channel code decider 534 to determine that the third (and final) bit of the channel code should be a '0'. Further during the third stage of the binary tree search, the difference value generated by the subtractor 535 is 200 which is less than the defined third stage range of 400. Therefore, the channel code determination result corresponding to the third stage is deemed to be correct, the channel code unit 534 sets the third bit of the channel code to '0', and the binary tree search is complete with a final channel code of 010 corresponding to an intermediate frequency closest to the target frequency (i.e., a corresponding count value of 2000 as compared with a reference value of 2200). That is, as a result of the non-errant, third (and final) stage channel code determination, a third (and final) updated channel code—a final channel code of '010'—is effectively applied to the VCO 510 which in turn generates an output signal having an appropriate intermediate frequency.

Thus ends the coarse tuning step and the frequency synthesizer 500 may now further tune the output of the VCO 510 (i.e., the intermediate frequency) towards the target frequency using a fine tuning loop (e.g., a PLL).

FIG. 7 conceptually illustrates an example of an errant binary tree search progression, as compared with FIG. 6. Similar assumptions are made with respect to FIGS. 5 and 7 as were made in relation to FIGS. 1 and 2. Thus, a reference value of 2200 is assumed to be provided by the control unit 531 to the first comparator 533 and subtractor 535. A first stage range of 1600 is set by the control unit 531 and provided to the second comparator 536, and an initial channel code is selected by the control unit 531 and applied to the channel code decider 534, where this initial channel code results in a corresponding count value of 3200.

Despite the fact that 3200 is greater than 2200, it is assumed that a bit error is generated during the first stage determination results. Thus, instead of the resulting comparison signal generated by the first comparator 533 causes the channel code decider 534 to determine that the first bit of the channel code should be a '0', the first bit is erroneously determined to be a '1'. However, during the first stage of the binary tree search, the difference value generated by the subtractor 535 is 2600 (4800−2200) which exceeds the defined first stage range of 1600. Therefore, the channel code determination result corresponding to the first stage is deemed to be erroneous, and the combination of the control unit 531 and/or channel code unit 534 nullifies the determination of the first bit of the channel code.

Nullification of the first bit (e.g., bit flipping the first bit form '1' to '0' or re-determining the first bit of the channel code followed by ratification by the corresponding correction signal) allows the binary tree search to proceed to the second stage. Thereafter, it is assumed that the second and third stages of the binary tree search are non-errantly executed, as previously described in relation to FIG. 6.

As previously suggested, different approaches may be used to determine an appropriate number of channel code bits, channel code determination stages, respective stage ranges, and nullification procedures.

Figure 8:
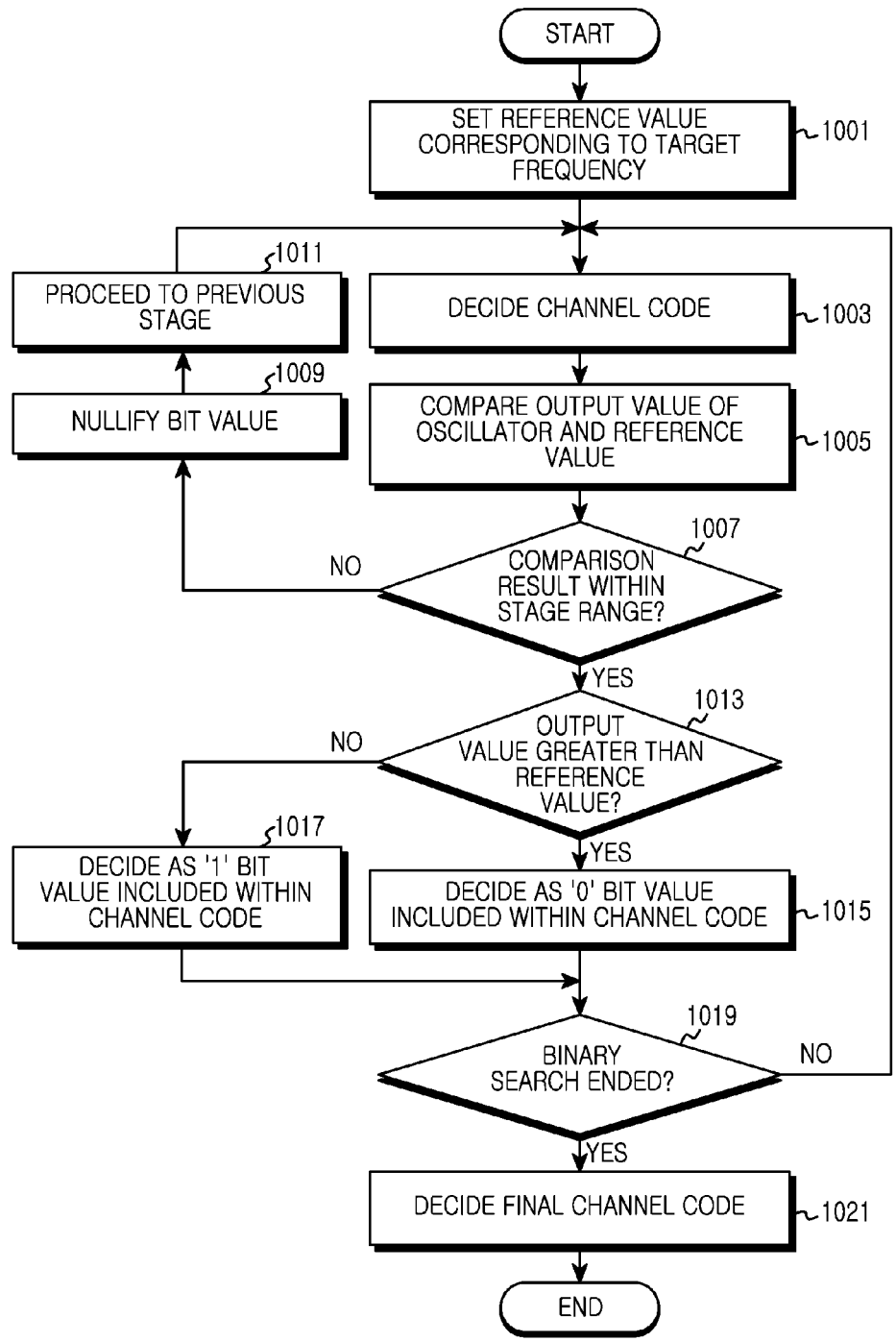
FIGS. 8, 9 and 10 are respective flowcharts variously illustrating method(s) for determining a channel code in a frequency synthesizer according to embodiments of the inventive concept.

FIG. 8 is a flowchart summarizing a method for determining a channel code during a coarse tuning step for a frequency synthesizer according to certain embodiments of the inventive concept. Reference is made to FIGS. 5 and 8 in this example.

In response to the selection of a desired target frequency for the output of the VCO 510, the control unit 531 selects a corresponding reference value associated with an intermediate frequency that is closest to the target frequency (or includes the target frequency within a corresponding intermediate frequency range) (1001). After the reference value is set, the control unit 531 selects an initial channel code (1003). The initial channel code may be variously selected by the control unit 531 to begin a channel code determination according to a binary tree search of possible channel code values. For example, an initial channel code may be selected in accordance with an intermediate frequency that is approximately half way from a highest intermediate frequency and a lowest intermediate frequency across a range of VCO frequencies.

Then, a comparison of the reference value and an output value indicative of the output of the VCO 510 resulting from the application of the initial channel code is made (1005). Should the comparison of the reference value and output value result in a difference value falling within a stage range established for the current stage (1007=YES), a further comparison is made between the output value and the reference value (1013). However, should the comparison of the reference value and output value result in a difference value falling outside the stage range established for the current stage (1007=NO), a nullification procedure is executed with respect to the current stage of the binary tree search (1009).

In certain embodiments of the inventive concept, the nullification procedure will be followed by a re-execution of one or more previously executed stages (1011). For example, the current stage may be repeated with the step of deciding a channel code (1003) returning the same channel code that will again be compared with the reference value (1005).

However, assuming that a difference value between the reference value and output value does not exceed a stage range (1007=YES), the comparison of the output value and reference value will result in one of two conditions. Either the output value will be greater than the reference value (S1013=YES) or the output value will be less than the reference value (S1013=NO). If the former condition is true, the channel code bit currently being determined will be a '0' (1015), and if the later condition is true the channel code bit being determined will be a '1' (1017).

As the method illustrated in FIG. 8 is an iterative (stage-by-stage) process, following the determination of each channel code bit, a determination is made as to whether all bits of a final channel code search have been decided (1019). Where additional channel code bits must be decided (1019=NO), the method returns to (1003) and a next stage of the binary tree search is executed. Where all channel code bits have been decided (1019=YES), a final channel code is decided and may be used to define an appropriate intermediate frequency as the result of a completed coarse tuning step for the frequency synthesizer 500.

Figure 9:
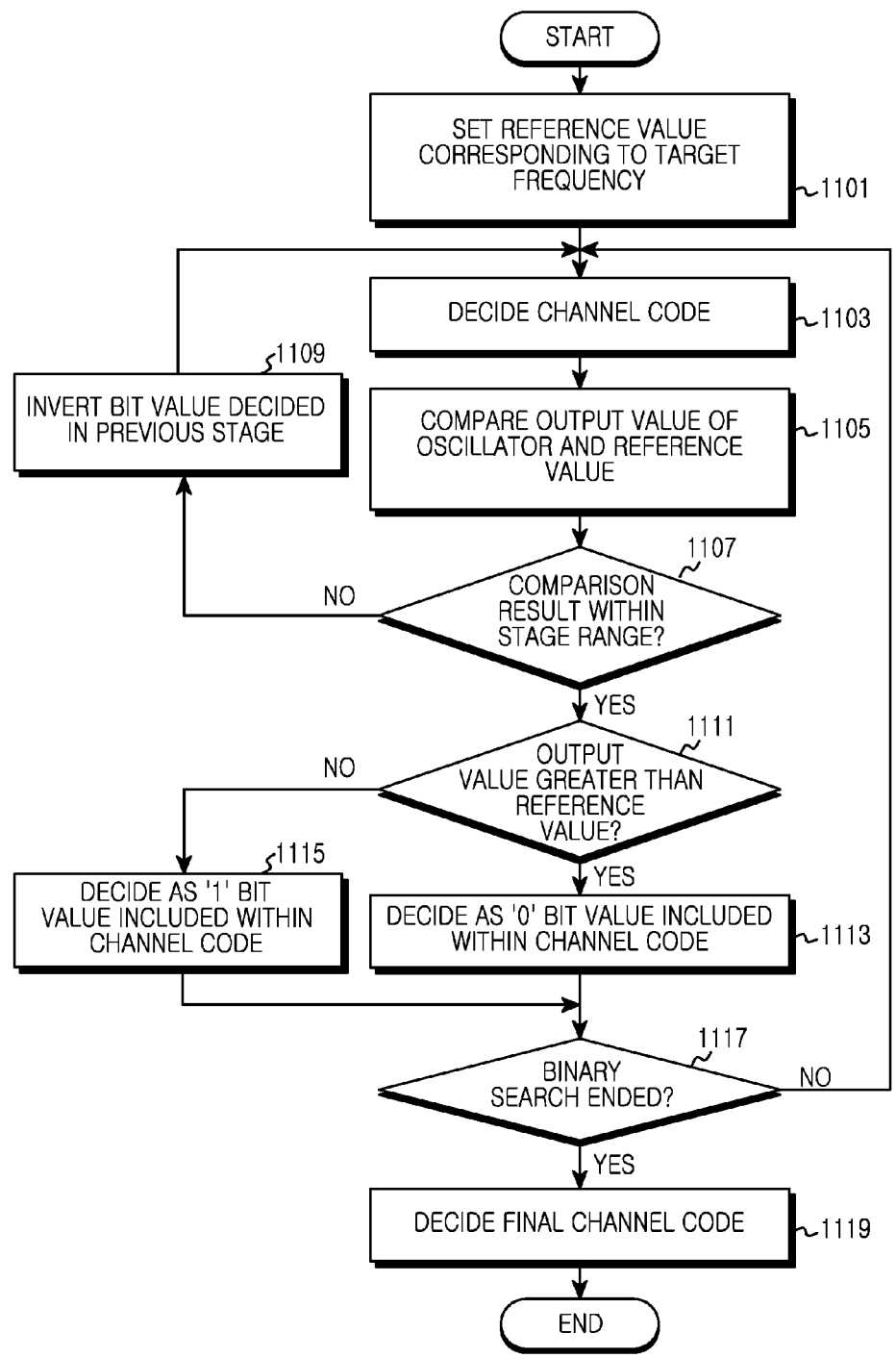

FIG. 9 is a flowchart summarizing a method for determining a channel code during a coarse tuning step for a frequency synthesizer according to certain embodiments of the inventive concept. Reference is made to FIGS. 5, 8 and 9 in this example.

Here, the method summarized in the flowchart of FIG. 9 is similar in every respect to the method summarized in the flowchart of FIG. 8, except for the flowchart branch reached when (1007=NO). Here, instead of making a nullification determination and re-executing at least the current stage (1009, 1011 in FIG. 10), erroneously determined bit(s) from the current stage are inverted (or flipped) to generate non-errant channel code bit(s) (1109).

Figure 10:
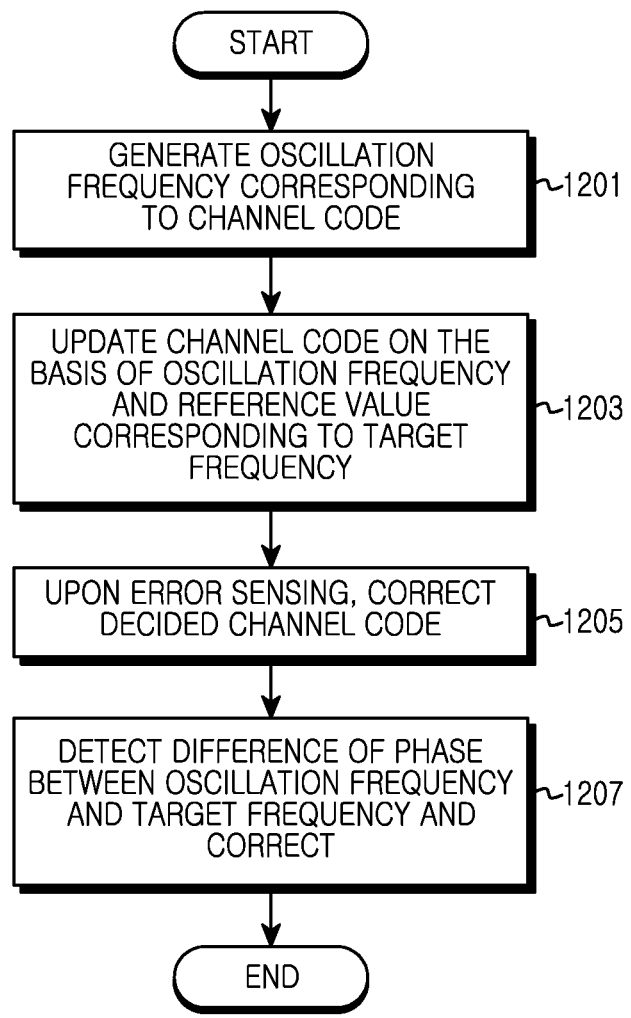

The coarse tuning step methods summarized in FIGS. 8 and 9 may be respectively incorporated within the general tuning method summarized in FIG. 10. Reference is made to FIGS. 4, 8, 8 and 10 in this example.

The oscillator 410 generates an oscillation frequency corresponding to a channel code applied by a frequency decider 430 (1201). The oscillator 410 may include a capacitor bank array comprised of capacitors of various sizes. In such embodiments a channel code selecting a unique combination of capacitors within the oscillator 410 will cause the oscillator 410 to generate one of a plurality of intermediate frequencies corresponding one-for-one with the range of different channel codes.

Using a coarse tuning loop, a final (and correct) channel code may be determined by updating the channel code in response to the oscillation frequency of the oscillator 410 and reference frequency (1203), as well as detecting and correcting any erroneously determined bits of the channel code (1205). Following determination of a final channel code (that correctly selects a closest intermediate frequency) by use of the coarse tuning loop, a residual phase difference between the oscillation frequency and target frequency may be detected and corrected by use of a fine tuning loop (e.g., phase locker 450).

By integrating a channel code error detection and correction approach into the generation of a channel code generated by execution of a binary tree search, costly performance problems associated with the coarse tuning of a frequency synthesizer may be avoided. Methods performed by embodiments of the inventive concept as described within the subject specification may be implemented in hardware, software, or a combination of hardware and software. If these methods are implemented in software, computer-readable storage medium storing one or more programs (i.e., software modules) may be provided. The one or more programs stored in the computer-readable storage medium are configured to be executed by one or more processors. The one or more programs include instructions for enabling the electronic device to execute the methods according to the embodiments stated in the claims and/or specification of the inventive concept.

These programs (i.e., software modules or software) may be stored in a Random Access Memory (RAM), a nonvolatile memory including a flash memory, a Read Only Memory (ROM), an Electrically Erasable Programmable ROM (EEPROM), a magnetic disk storage device, a Compact Disk ROM (CD-ROM), a Digital Versatile Disk (DVD) or an optical storage device of other form, and a magnetic cassette.

While the inventive concept has been shown and described with reference to certain illustrated and explicitly described embodiments thereof, it will be understood by those skilled in the art that various changes in form and details may be made therein without departing from the scope of the inventive concept as defined by the appended claims.

What is claimed is:

1. A frequency synthesizer comprising:
   an oscillator configured to generate an oscillation frequency corresponding to a first channel code comprising a first plurality of bit values;
   a frequency decider configured to:
   (i) determine a bit value among the first plurality of bit values for the first channel code by comparing an output value corresponding to the oscillation frequency and a reference value corresponding to a target frequency,
   (ii) perform an error correction on the determined bit value by comparing a different value between the output value and the reference value with a predetermined stage range value, and
   repeatedly perform (i) and (ii) until all of a second plurality of bit values for a second channel code are determined; and
   a phase locker configured to fine tune, based on the second channel code, the oscillation frequency to the target frequency.

2. The frequency synthesizer of claim 1, wherein the frequency decider is configured to use a binary tree search to coarse tune the oscillation frequency, wherein each stage of the binary tree search generates a corresponding binary tree search result.

3. The frequency synthesizer of claim 2, wherein the frequency decider comprises:
   a first comparator configured to compare the output value with the reference value during each stage of the binary tree search to generate a comparison signal;
   a corrector configured to generate a correction signal by comparing, during each stage of the binary tree search, a difference value between the output value and the reference value with a stage range value, wherein upon determining that the difference value exceeds the range stage value, the correction signal indicates the error in the channel code; and
   a channel code decider configured to determine the bit value in response to the comparison signal and the correction signal.

4. The frequency synthesizer of claim 3, wherein the frequency decider further comprises a controller configured to provide the reference value to the first comparator and the corrector.

5. The frequency synthesizer of claim 4, further comprising a counter configured to receive the oscillation frequency and generate a count value as the output value.

6. The frequency synthesizer of claim 5, wherein the corrector comprises:
   a subtractor configured to receive the count value and the reference value and generate the different value; and
   a second comparator configured to receive the difference value and stage range value and generate the correction signal.

7. The frequency synthesizer of claim 6, wherein the correction signal is provided to at least one of the channel code decider and controller.

8. The frequency synthesizer of claim 7, wherein the controller is configured to cause, upon receiving the correction signal indicating the error in the channel code, the channel code decider to nullify at least one binary tree search result.

9. The frequency synthesizer of claim 8, wherein the channel code decider is configured to invert the at least one channel code bit upon nullifying the at least one binary tree search result.

10. The frequency synthesizer of claim 8, wherein the controller is configured to cause the channel code decider to re-execute at least one stage of the binary tree search.

11. The frequency synthesizer of claim 8, wherein
    the controller is configured to nullify the at least one binary tree search result by causing a most recently determined channel code bit to be re-determined by re-executing a corresponding stage of the binary tree search.

12. The frequency synthesizer of claim 3, wherein the oscillator is a voltage control oscillator (VCO) including a capacitor bank array, and
    the frequency decider is an Auto Bank Calibration (ABC) unit configured to apply the channel code to the capacitor bank array to control the generation of the oscillation frequency.

13. A frequency synthesizer providing an output signal having a target frequency, the frequency synthesizer comprising:
    a voltage control oscillator (VCO) configured to generate the output signal;
    a first tuning loop configured to course tune the output signal to an intermediate frequency in response to a channel code selected on the basis of the target frequency, wherein the first tuning loop is configured to correct an error in a determination of the channel code during the coarse tuning using a channel code decider configured to determine the channel code by using a binary tree search, and the error correction in the determination of the channel code is performed with reference to a stage range for each stage of the binary tree search; and
    a second tuning loop configured to fine tune the output signal from the intermediate frequency to the target frequency based on completion of the first tuning loop.

14. The frequency synthesizer of claim 13, wherein the VCO is tunable over a broad range of frequencies including a plurality of intermediate frequencies, each intermediate frequency being uniquely associated with one of a plurality of channel codes.

15. The frequency synthesizer of claim 13, wherein the first tuning loop further comprises:
    a controller configured to provide a stage range value for each stage of the binary tree search, and provide a reference value in response to the target frequency;
    a prescaler configured to receive the output signal and convert the output signal to a scaled signal;
    a counter configured to receive the scaled signal and generate a count value indicative of a frequency of the output signal;
    a first comparator configured to receive the count value and the reference value and generate a comparison signal;
    a corrector configured to generate a difference value from the count value and reference value and compare the difference value to the stage range value to generate a correction signal,
    wherein the channel code decider is configured to determine the channel code in response to the comparison signal and the correction signal.

16. The frequency synthesizer of claim 13, wherein the second tuning loop comprises a phase lock loop (PLL) circuit.

17. A frequency synthesizer comprising:
a voltage controlled oscillator (VCO) configured to generate frequencies including a plurality of intermediate frequencies, wherein the plurality of intermediate frequencies correspond one-for-one with a plurality of channel codes;
a frequency decider configured to
upon receiving an instruction identifying a target frequency for the VCO, control a coarse tuning step of the VCO, such that the VCO generates an output signal having a desired intermediate frequency among the plurality of intermediate frequencies,
wherein the coarse tuning step generates a comparison signal by comparing a reference value corresponding to the target frequency and an output signal indicative of the output signal and generates a correction signal by determining whether a difference value between the reference value and the output value exceeds a stage range value, such that the frequency decider traverses a binary search tree generated in accordance with the plurality of channel codes in response to the comparison signal and the correction signal.

18. The frequency synthesizer of claim 17, wherein the frequency decider is configured to traverse the binary search tree stage by stage, each stage of the binary tree search determining at least one bit of a final channel code corresponding to the desired intermediate frequency.

\* \* \* \* \*